(12) United States Patent
Liu et al.

(10) Patent No.: US 9,793,242 B2
(45) Date of Patent: Oct. 17, 2017

(54) PACKAGES WITH DIE STACK INCLUDING EXPOSED MOLDING UNDERFILL

(71) Applicant: Taiwan Semiconductor Manufacturing Company, Ltd., Hsin-Chu (TW)

(72) Inventors: Yu-Chih Liu, Taipei (TW); Hai-Ming Chen, Kaohsiung (TW); Wei-Ting Lin, Taipei (TW); Jing Ruei Lu, Taipei (TW); Tsung-Ding Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 67 days.

(21) Appl. No.: 14/143,895

(22) Filed: Dec. 30, 2013

(65) Prior Publication Data
US 2015/0187734 A1     Jul. 2, 2015

(51) Int. Cl.
| H01L 21/00 | (2006.01) |
| H01L 25/065 | (2006.01) |
| H01L 25/00 | (2006.01) |
| H01L 25/10 | (2006.01) |
| H01L 21/56 | (2006.01) |
| H01L 23/31 | (2006.01) |
| H01L 23/367 | (2006.01) |
| H01L 23/373 | (2006.01) |
| H01L 23/498 | (2006.01) |
| H01L 23/42 | (2006.01) |

(52) U.S. Cl.
CPC ........ *H01L 25/0657* (2013.01); *H01L 25/105* (2013.01); *H01L 25/50* (2013.01); *H01L 21/56* (2013.01); *H01L 23/3128* (2013.01); *H01L 23/3675* (2013.01); *H01L 23/3737* (2013.01); *H01L 23/42* (2013.01); *H01L 23/49827* (2013.01); *H01L 2224/16145* (2013.01); *H01L 2224/73253* (2013.01); *H01L 2225/06541* (2013.01); *H01L 2225/06548* (2013.01)

(58) Field of Classification Search
CPC ......... H01L 2924/00; H01L 2225/1058; H01L 25/0657; H01L 2924/00014; H01L 2224/32225; H01L 2224/48227; H01L 2224/73204; H01L 2924/181; H01L 24/73
USPC ....... 438/106, 107, 108, 109, 112, 124, 126, 438/127
See application file for complete search history.

(56) References Cited

U.S. PATENT DOCUMENTS

| 6,081,997 | A | * | 7/2000 | Chia | ..................... H01L 21/565 |
|  |  |  |  |  | 257/E21.504 |
| 2002/0109241 | A1 | * | 8/2002 | Kumamoto et al. | .......... 257/787 |
| 2005/0275080 | A1 | * | 12/2005 | Chung | ................. H01L 25/0657 |
|  |  |  |  |  | 257/686 |

(Continued)

*Primary Examiner* — David Chen
(74) *Attorney, Agent, or Firm* — Slater Matsil, LLP

(57) ABSTRACT

A method includes bonding a first device die onto a top surface of a package substrate, and performing an expose molding on the first device die and the package substrate. At least a lower portion of the first device die is molded in a molding material. A top surface of the molding material is level with or higher than a top surface of the first device die. After the expose molding, a second device die is bonded onto a top surface of the first device die. The second device die is electrically coupled to the first device die through through-silicon vias in a semiconductor substrate of the first device die.

20 Claims, 14 Drawing Sheets

(56) References Cited

U.S. PATENT DOCUMENTS

| | | | |
|---|---|---|---|
| 2007/0023488 A1* | 2/2007 | Lawlyes | H01L 21/563 228/180.22 |
| 2007/0029106 A1* | 2/2007 | Kato | H01L 23/49822 174/255 |
| 2007/0141751 A1* | 6/2007 | Mistry | H01L 21/561 438/109 |
| 2007/0222050 A1* | 9/2007 | Lee et al. | 257/678 |
| 2010/0019377 A1* | 1/2010 | Arvelo et al. | 257/712 |
| 2010/0237481 A1* | 9/2010 | Chi | H01L 23/3107 257/685 |
| 2011/0147916 A1* | 6/2011 | Su | 257/692 |
| 2012/0056314 A1* | 3/2012 | Pagaila et al. | 257/734 |
| 2012/0074581 A1* | 3/2012 | Guzek | H01L 23/481 257/774 |
| 2012/0119346 A1* | 5/2012 | Im | H01L 21/563 257/690 |
| 2012/0171814 A1* | 7/2012 | Choi | H01L 21/561 438/107 |
| 2012/0211885 A1* | 8/2012 | Choi | H01L 23/3128 257/737 |
| 2015/0130078 A1* | 5/2015 | Hong | H01L 23/34 257/774 |

* cited by examiner

PACKAGES WITH DIE STACK INCLUDING EXPOSED MOLDING UNDERFILL

BACKGROUND

In the packaging of integrated circuits, device dies are bonded onto package substrates, which include metal connections that are used to route electrical signals between opposite sides of the package substrates. The device dies may be bonded onto one side of a package substrate using flip chip bonding, and a reflow is performed to melt the solder balls that interconnect the dies and the package substrate.

The package substrates may use organic materials that have high Coefficients of Thermal Expansion (CTEs), such as materials that can be easily laminated. During the bonding process, since the dies and the package substrates have significantly different CTEs, the warpage in the device dies and the package substrates is worsened. For example, the silicon in the dies may have a CTE of 3.2 ppm/° C., while the package substrates may have a CTE between about 17 ppm/° C. and 20 ppm/° C. The warpage in the package substrates may cause irregular joints and/or bump cracks. As a result, the yield of the packaging process is adversely affected.

In conventional packages, when a Chip-on-Chip-on-Substrate (CoCoS) package is formed, a device die is bonded to a package substrate first. An underfill is then dispensed into the gap between the device die and the package substrate, followed by the curing of the underfill. Since the underfill is dispensed through capillary, it may climb onto the top surface of the first device die, which effect is referred to as underfill overflow. The underfill may also spread far away from the device die, which effect is referred to as underfill bleeding. Both underfill overflow and underfill bleeding cause reliability problems of the resulting package.

In addition, the conventional CoCoS packaging also faces problems since the package substrate and the first device die may warp after their bonding. This poses problems for bonding additional dies onto the device die. Conventionally, the metal lid that is attached to the top surface of the die stack also includes a skirt portion extending down to encircle the die stack, wherein the skirt portion is attached to the package substrate through an adhesive. The metal lid thus has the function of reducing warpage of the package substrate.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 6A are cross-sectional views of intermediate stages in the formation of a Chip-on-Chip-on-Substrate (CoCoS) package in accordance with some exemplary embodiments;

FIGS. 7 through 12A are cross-sectional views of intermediate stages in the formation of a CoCoS package in accordance with alternative embodiments.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A Chip-on-Substrate (CoS) package (which may also be a Chip-on-Chip-on-Substrate (CoCoS) package) and the method of forming the same are provided. The intermediate stages of forming the package in accordance with some embodiments are illustrated. The variations of the embodiments are discussed. Throughout the various views and illustrative embodiments, like reference numbers are used to designate like elements.

Figure 1:
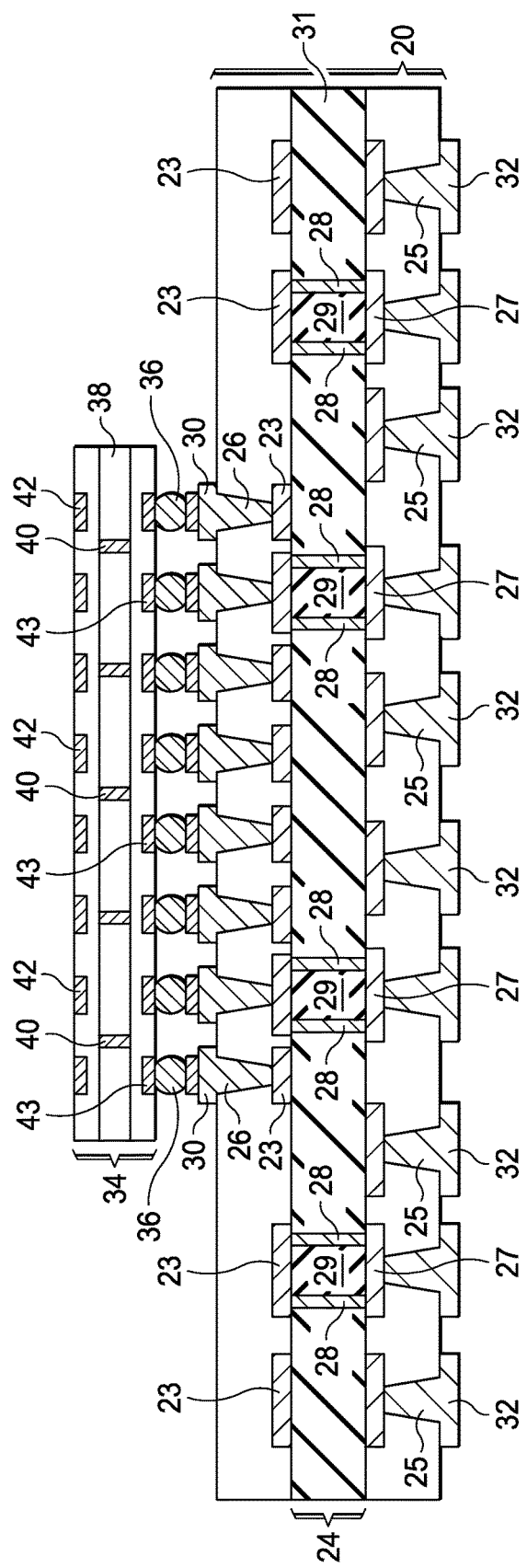

FIGS. 1 through 6A illustrate the cross-sectional views of intermediate stages in the formation of a package in accordance with some exemplary embodiments. Referring to FIG. 1, package substrate 20 is provided. In some exemplary embodiments, package substrate 20 is a build-up substrate that is built up from core 24. In alternative embodiments, package substrate 20 is a laminate substrate that includes conductive traces embedded in laminated dielectric films. In the subsequent discussion of the embodiments of the present disclosure, a build-up substrate is illustrated as an example, while the teaching revealed in accordance with the exemplary embodiments are readily applicable for laminate substrates.

In the exemplary embodiments that package substrate 20 is a build-up substrate, package substrate 20 includes core 24, and metal layers formed on the opposite sides of core 24. Throughout the description, the term "metal layer" refers to the collection of all metal features, including, and not limited to, metal traces and metal pads, that are at the same level. In some exemplary embodiments as shown in FIG. 1, package substrate 20 includes metal layers overlying core 24, and metal layers underlying core 24. The exemplary metal layers over core 24 include metal lines and pads 23 and 30. The exemplary metal layers underlying core 24 include metal lines and pads 27 and 32.

Package substrate 20 may include one or more metal layers on each side of core 24. For example, in the exemplary embodiments shown in FIG. 1, there are two metal layers on each side of core 24. The metal layers overlying core 24 and the metal layers underlying core 24 are electrically interconnected through metal vias 25, 26, and 28. The metal features in the metal layers may comprise copper, aluminum, nickel, gold, or combinations thereof.

Core 24 includes core dielectric layer 31, and metal vias 28 penetrating through core dielectric layer 31. In some embodiments, core dielectric layer 31 comprises one or more material selected from epoxy, resin, glass fiber, molding compound, plastic (such as PolyVinylChloride (PVC), Acrylonitril, Butadiene & Styrene (ABS), Polypropylene (PP), Polyethylene (PE), PolyStyrene (PS), Polymethyl Methacrylate (PMMA), Polyethylene Terephthalate (PET), Polycarbonates (PC), Polyphenylene sulfide (PPS), combinations thereof, and multi-layers thereof. Metal vias 28 may be formed as conductive pipes in some exemplary embodiments. The internal volumes of metal vias 28 are filled with dielectric filling 29, which may be a material selected from the same candidate materials for forming core dielectric layer 31. In alternative embodiments, conductive pipes 28 comprise air gaps 29 therein. Metal vias 28 electrically interconnect, and may be in physical contact with, the metal features 23 in the immediate overlying metal layer and the metal features 27 in the immediate underlying metal layer. The metal layers are formed in dielectric layers, which may be formed of Polypropylene, for example.

Package substrate 20 includes top electrical connectors 30, which may be parts of the top metal layer. In some embodiments, top electrical connectors 30 comprise metal pads. Package substrate 20 further includes bottom electrical connectors 32, which may comprise the metal pads that are parts of the bottom metal layer. In alternative embodiments, top electrical connectors 30 and bottom electrical connectors 32 comprise metal pillars. Top electrical connectors 30 and bottom electrical connectors 32 are electrically interconnected through metal vias 25, 26, and 28 and the metal lines in the metal layers.

Device die 34 is bonded to package substrate 20. In some embodiments, the bonding is through solder bonding, wherein solder regions 36 bond device die 34 and package substrate 20 together. In alternative embodiments, the bonding is through metal-to-metal (for example, copper-to-copper) direct bonding. Device die 34 may be a logic die, which may further be a Central Processing Unit (CPU), a Graphic Processing Unit (GPU), or the like.

Device die 34 includes semiconductor substrate 38, wherein the active devices (not shown) such as transistors are formed at a surface of semiconductor substrate 38. Through-vias (TVs, sometimes referred to as Through-Silicon Vias (TSVs) or through-semiconductor vias) 40 are formed to penetrate through semiconductor substrate 38. Additional electrical connectors (such as metal pads, metal pillars, or solder layers on metal pillars/pad) 42 are formed on the top surface of device die 34. Electrical connectors 43 are formed at the bottom surface of device die 34. Electrical connectors 42 and 43 may be metal pads, metal pillars, or the like. Electrical connectors 42 are electrically coupled to electrical connectors 36 and electrical connectors 43 through TVs 40.

Figure 2:
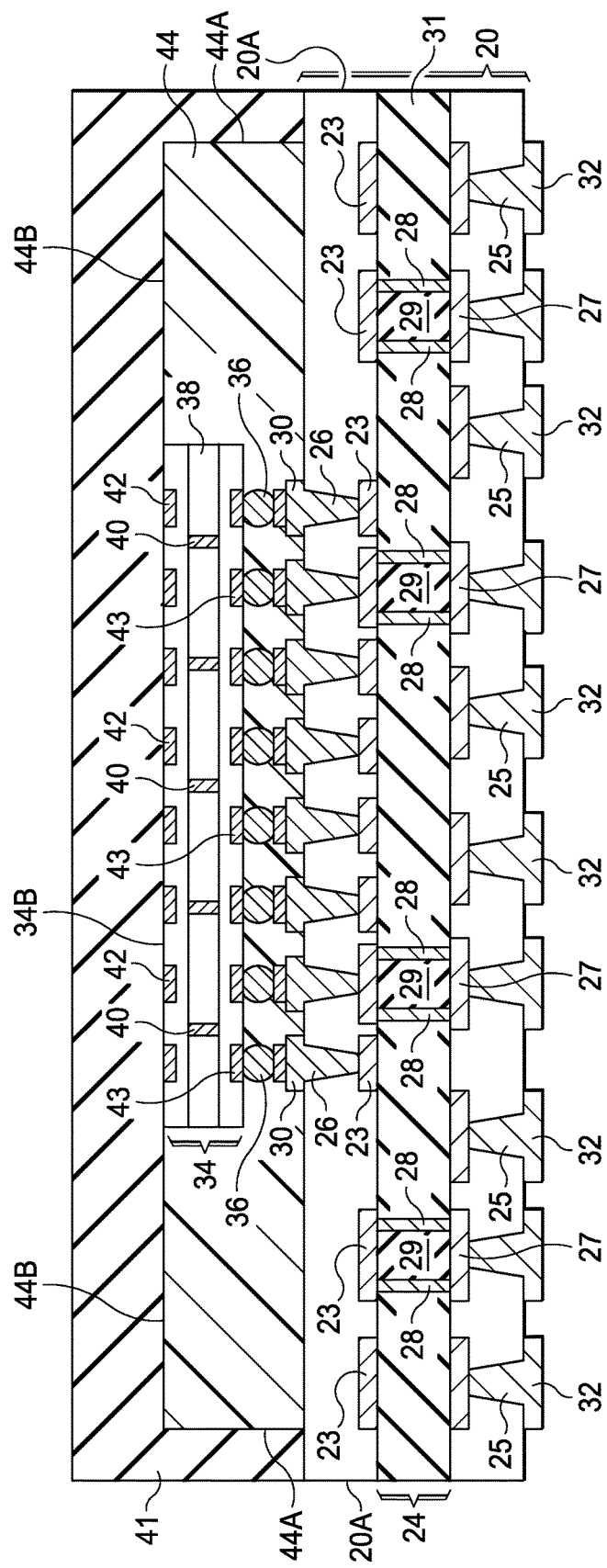

Referring to FIG. 2, molding material 44 is molded onto package substrate 20. Molding material 44 may be a polymer, a resin, or the like. In some embodiments, molding material 44 comprises a molding underfill, which acts as a molding compound and an underfill. Accordingly, molding material 44 is filled into the gap between device die 34 and package substrate 20, and may be in contact with, and surrounds, solder regions 36. In addition, molding material 44 extend beyond the edges of device die 34 toward the edges 20A of package substrate 20.

In some embodiments, the molding is an expose molding, wherein the top surface 34B of device die 34 is exposed through molding material 44. Furthermore, the molding may be performed using transfer molding. In some exemplary embodiments, the molding is performed using mold 41 to cover the top surface of device die 34, so that the resulting molding material 44 will not cover the top surface of device die 34. During the transfer molding, the inner space of mold 41 is vacuumed, and molding material 44 is injected into the inner space of mold 41. FIG. 2 shows that the edges 44A of molding material 44 are spaced apart from the edges 20A of package substrate 20 in accordance with some embodiments. In alternative embodiments, the edges 44A of molding material 44 are aligned to the respective edges 20A of package substrate 20 to form continuous vertical edges. As shown in FIG. 2, edges 44A are substantially straight and vertical.

Due to the expose molding, top surface 44B of molding material 44 is substantially planar, and may be substantially level with the major top surface 34B of device die 34. In some embodiments, top surface 44B of molding material 44 is coplanar with top surface 34B of device die 34. In alternative embodiments, top surface 44B of molding material 44 is slightly lower than, and may be parallel to, top surface 34B of device die 34.

Package substrate 20 may comprise organic materials, which may have high Coefficients of Thermal Expansion (CTEs). Device die 34, on the other hand, has much lower CTEs. For example, package substrate 20 may have a CTE greater than about 10 ppm/° C., and substrate 38 (for example, a silicon substrate) in device die 34 may have a CTE equal to about 3.2 ppm/° C. Accordingly, if molding material 44 is not molded on package substrate 20, the combined structure of package substrate 20 and device die 34 will have a high warpage. Molding material 44, on the other hand, has a high CTE close to that of package substrate 20. Therefore, with molding material 44 molding device die 34 therein, the warpage of the structure shown in FIG. 2 is reduced than if molding material 44 is not applied. The reduced warpage makes it much easier for the bonding of more dies on device die 34 with reduced risk of bonding failure.

Figure 3:
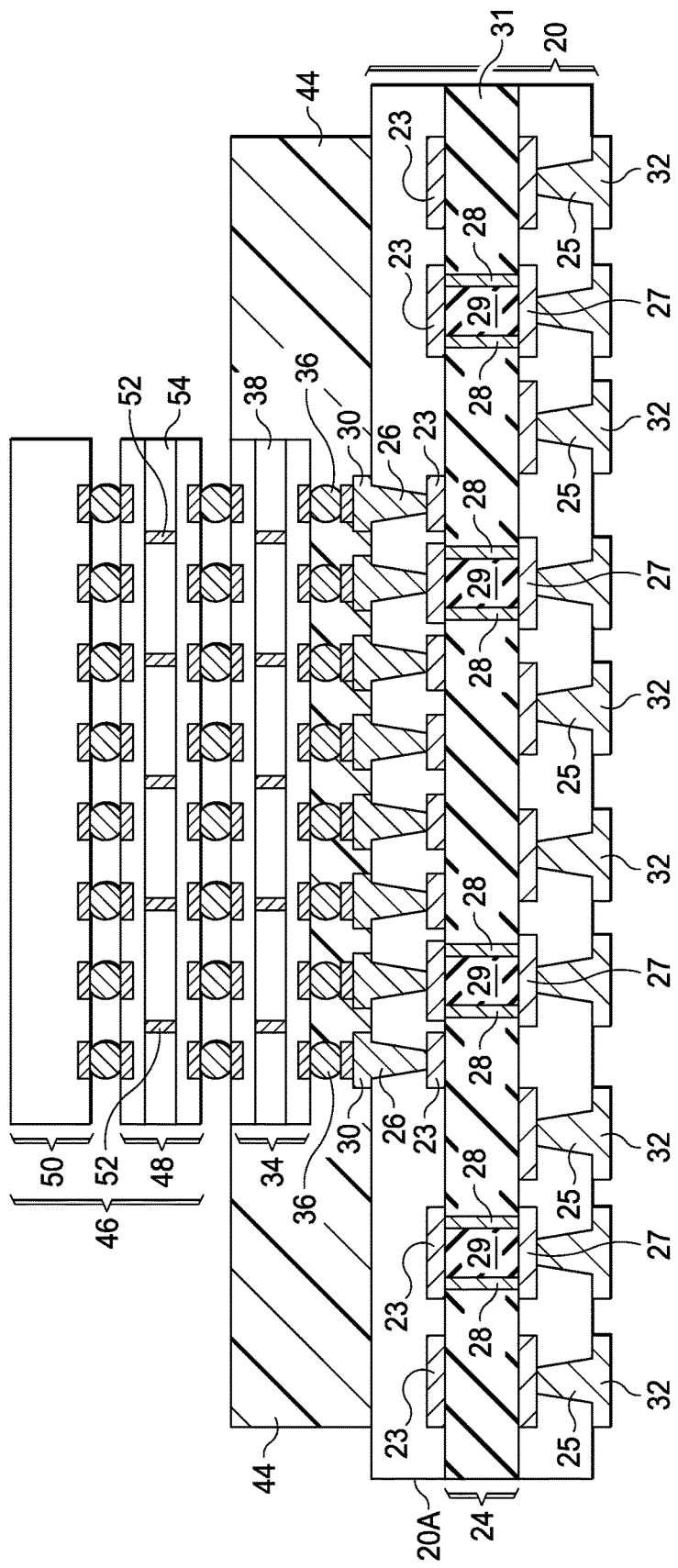

Referring to FIG. 3, one or more device die is bonded to device die 34. The bonding may be solder bonding, direct metal-to-metal bonding, or the like. In some embodiments, a single device die is bonded to device die 34. In alternative embodiments, a die stack including a plurality of dies is bonded to device die 34. For example, FIG. 3 illustrates die stack 46, which includes stacked dies 48 and 50, bonded to device die 34. Die stack 46 may also include three, four, or more device dies therein. In some embodiments, die stack 46 includes a plurality of memory dies.

Device dies 48 and 50 may be bonded one-by-one in some embodiments. In alternative embodiments, device dies 48 and 50 are bonded together as a die stack first. The die stack is then bonded to device die 34. In these embodiments, die 48 may include TSVs 52 penetrating through semiconductor substrate 54, wherein TSVs 52 electrically couple the devices in die 50 to device die 34 and/or package substrate 20. Device die 50 may include TSVs therein, or may be free from TSVs therein.

In some embodiments, the edges of die stack 46 are aligned to the respective edges of device die 34. The top-view area of die stack 46 may also be equal to the top-view area of device die 34.

Figure 4:
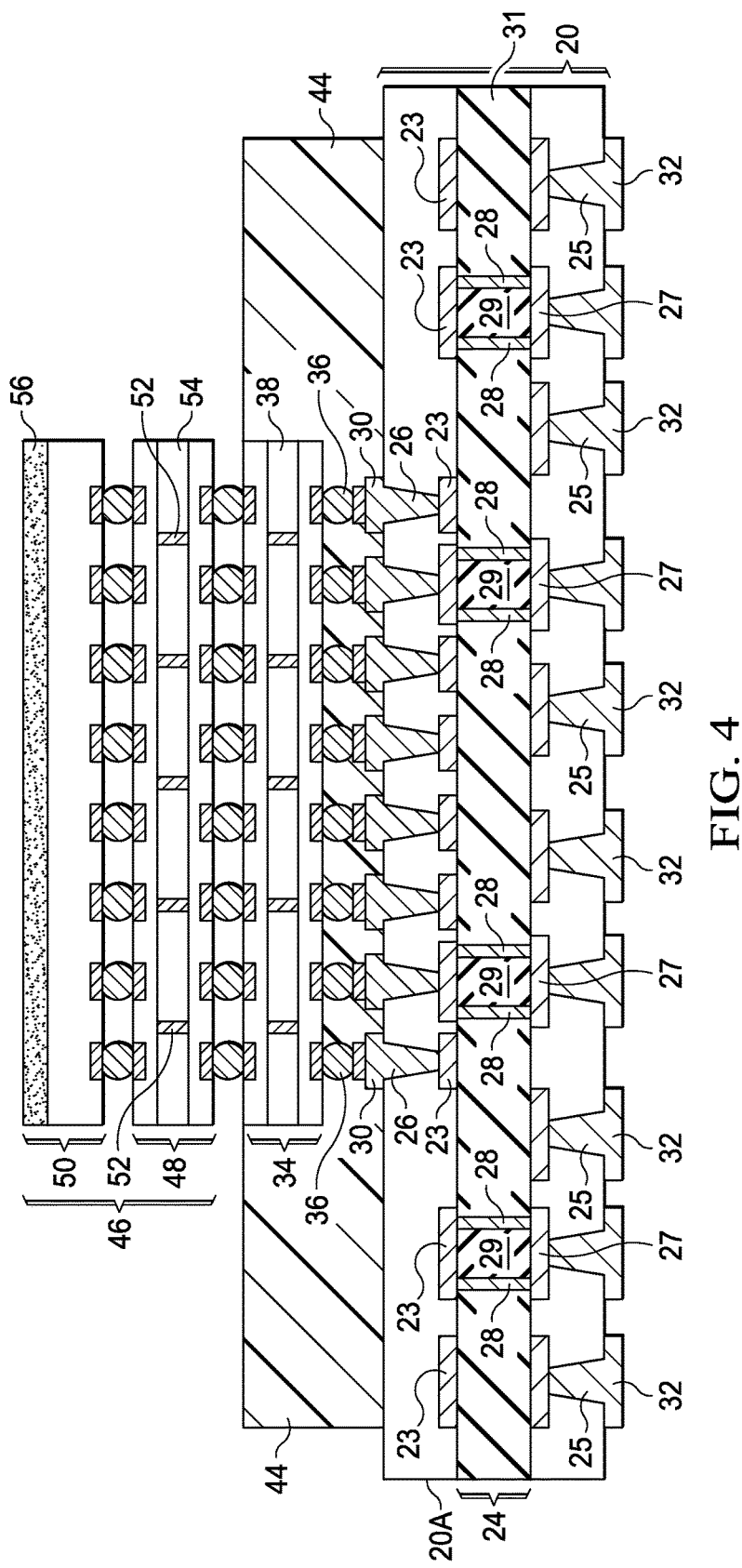

FIG. 4 illustrates the application of Thermal Interface Material (TIM) 56, which is an adhesive having a high thermal conductivity. In some embodiments, TIM 56 has a thermal conductivity higher than about 2 W/m*K or higher.

Figure 5:
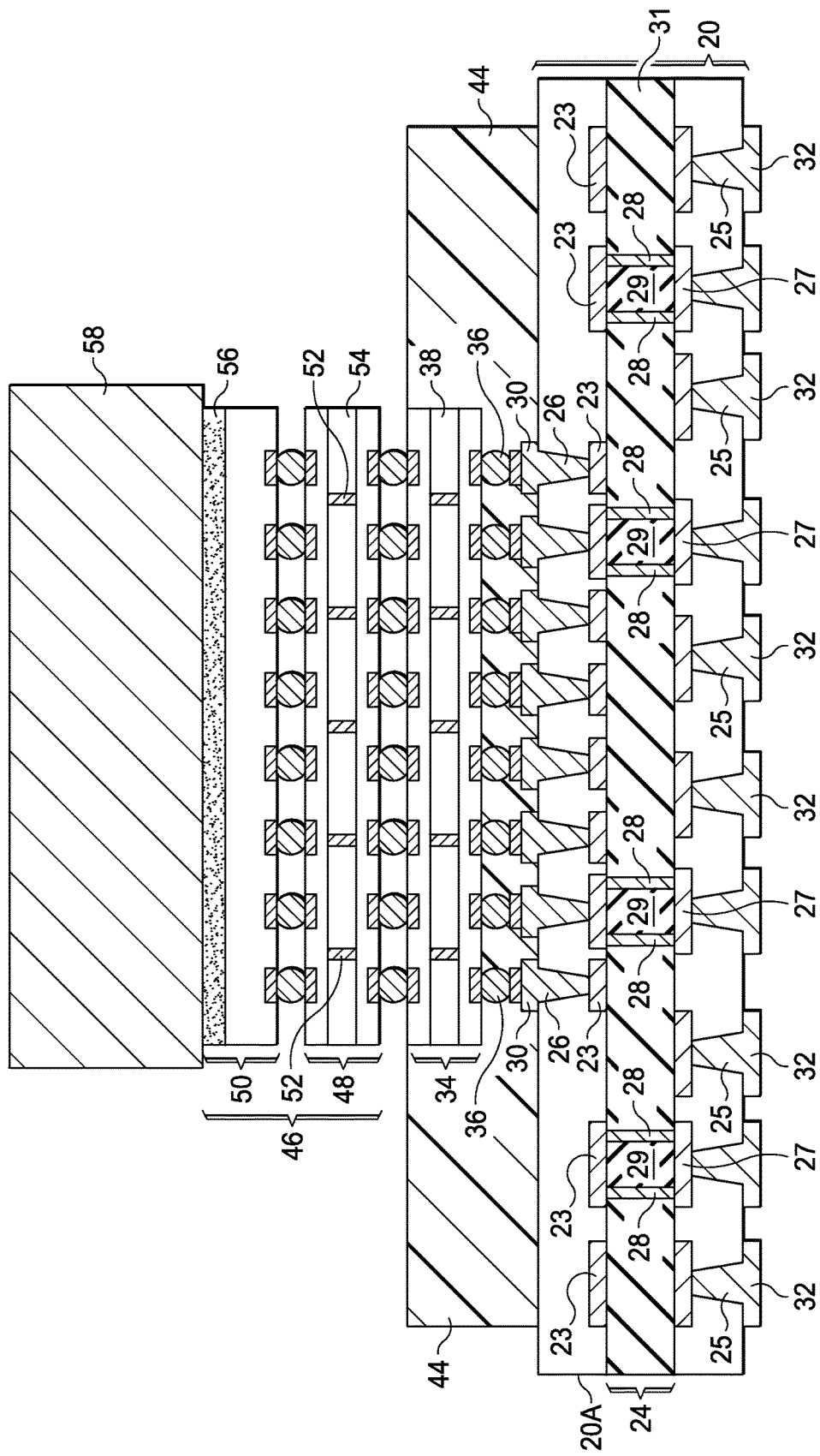

Next, as shown in FIG. 5, lid 58 is placed over TIM 56, and is adhered to die stack 46 through TIM 56. In some embodiments, lid 58 is a metal lid, which may comprise copper, aluminum, stainless steel, iron, or the like. Accordingly, the heat generated in device dies 34 and die stack 46 may be dissipated into lid 58 through TIM 56. In accordance with some embodiments, as shown in FIG. 5, an entirety of lid 58 is over die stack 46, and lid 58 does not include any part attached to package substrate 20. Since molding material 44 has the function of reducing warpage, lid 58 may not have to have the function of reducing warpage, which function was achieved in conventional packages by including portions extend down to attach to package substrate 20.

Figure 6A:
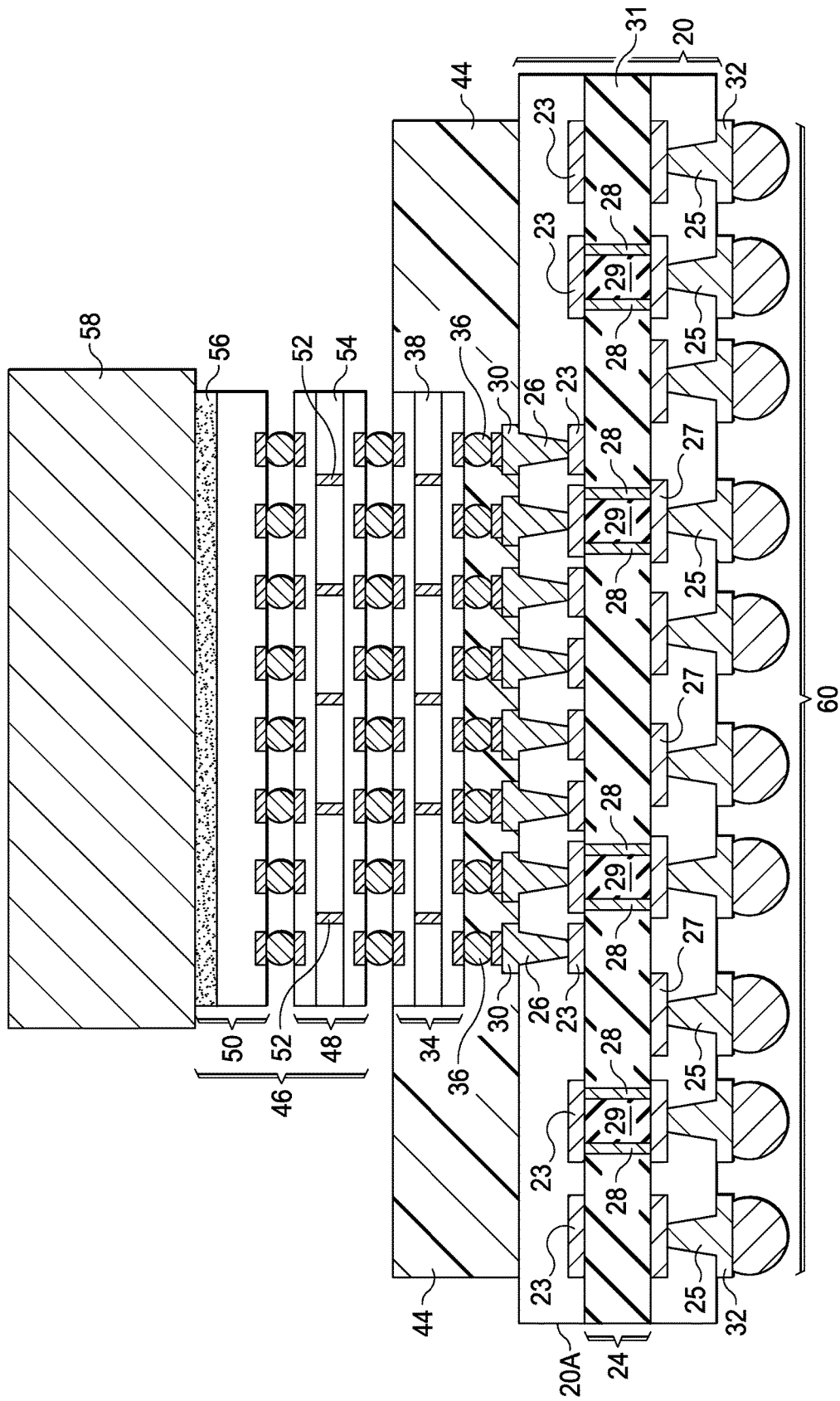
Figure 6B:
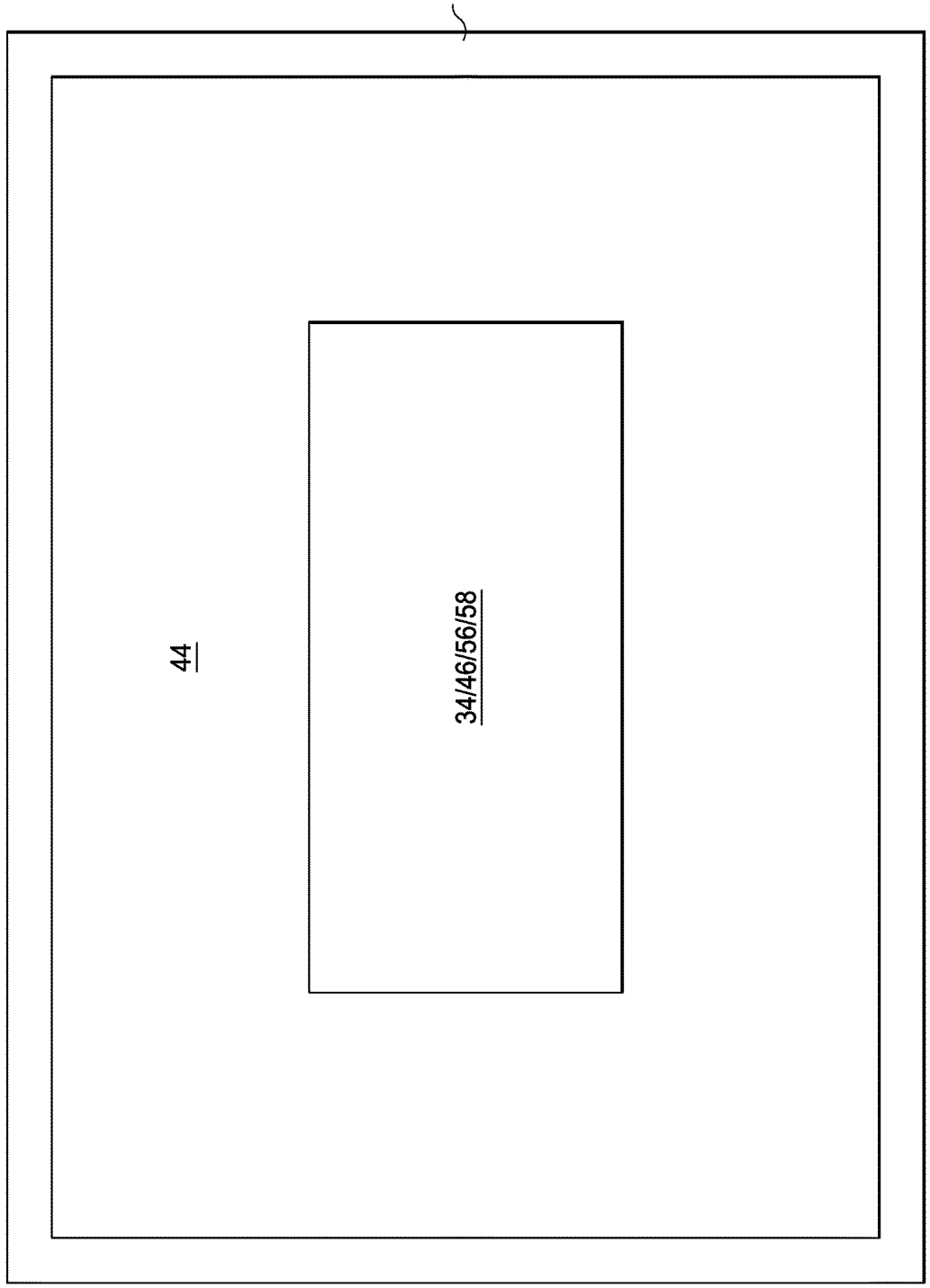
FIG. 6B illustrates a top view of a CoCoS package in accordance with some embodiments.

In FIG. 6A, solder balls 60 are mounted on metal pads 32, and are then reflowed. The formation of the CoCoS package is thus finished. FIG. 6B illustrates a top view of the CoCoS package. As shown in FIGS. 6A and 6B, molding material 44, besides extending into the gap between device die 34, also extends toward the edges of package substrate 20. Hence, molding material 44 also encircles device die 34, as shown in FIG. 6B. The extension of molding material 44 toward the edges of package substrate 20 results in the increase in the area of molding material 44, and hence the effect of reducing the warpage of the CoCoS package is improved.

FIGS. 7 through 12A illustrate cross-sectional views of intermediate stages in the formation of a CoCos package in accordance with alternative embodiments. Unless specified otherwise, the materials and the formation methods of the components in these embodiments are essentially the same as the like components, which are denoted by like reference numerals in the embodiments shown in FIGS. 1 through 6B. The details regarding the formation process and the materials of the components shown in FIGS. 7 through 12A may thus be found in the discussion of the embodiment shown in FIGS. 1 through 6B.

Figure 7:
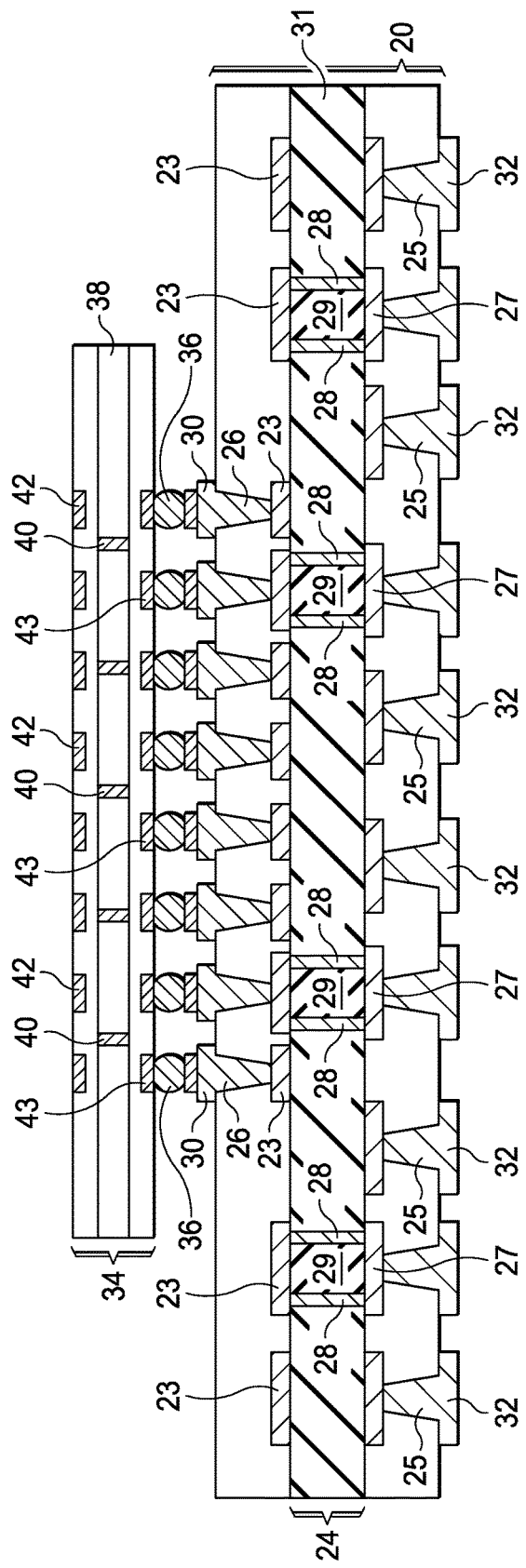
Figure 8:
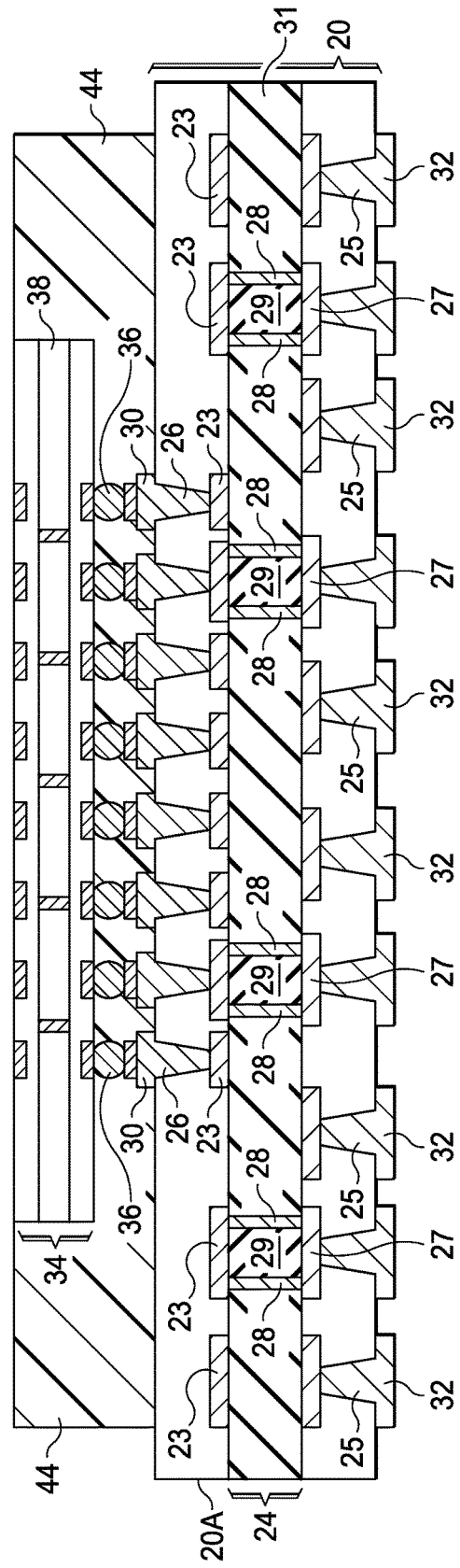
Figure 9:
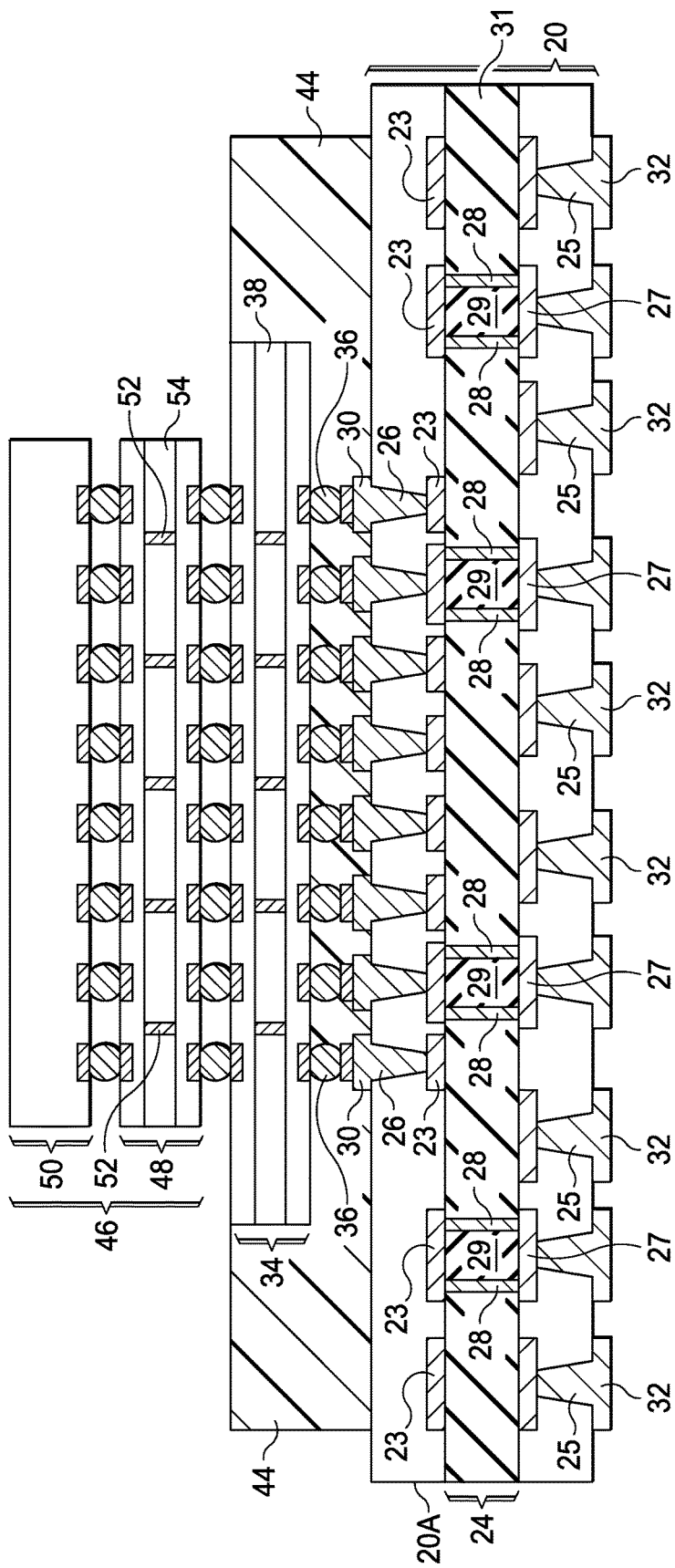

The initial steps of these embodiments are shown in FIGS. 7 and 8, which are essentially the same as the steps shown in FIGS. 1 and 2, respectively. Next, die stack 46 is bonded on device die 34, as shown in FIG. 9. Device die 34 has a top-view area greater than the top-view area of die stack 46 (refer to FIG. 12B). Accordingly, device die 34 has at least one side extending beyond the respective edge of the overlying die stack 46. In some exemplary embodiments, device die 34 extends beyond all edges of die stack 46, as shown in FIG. 12B.

Figure 10:
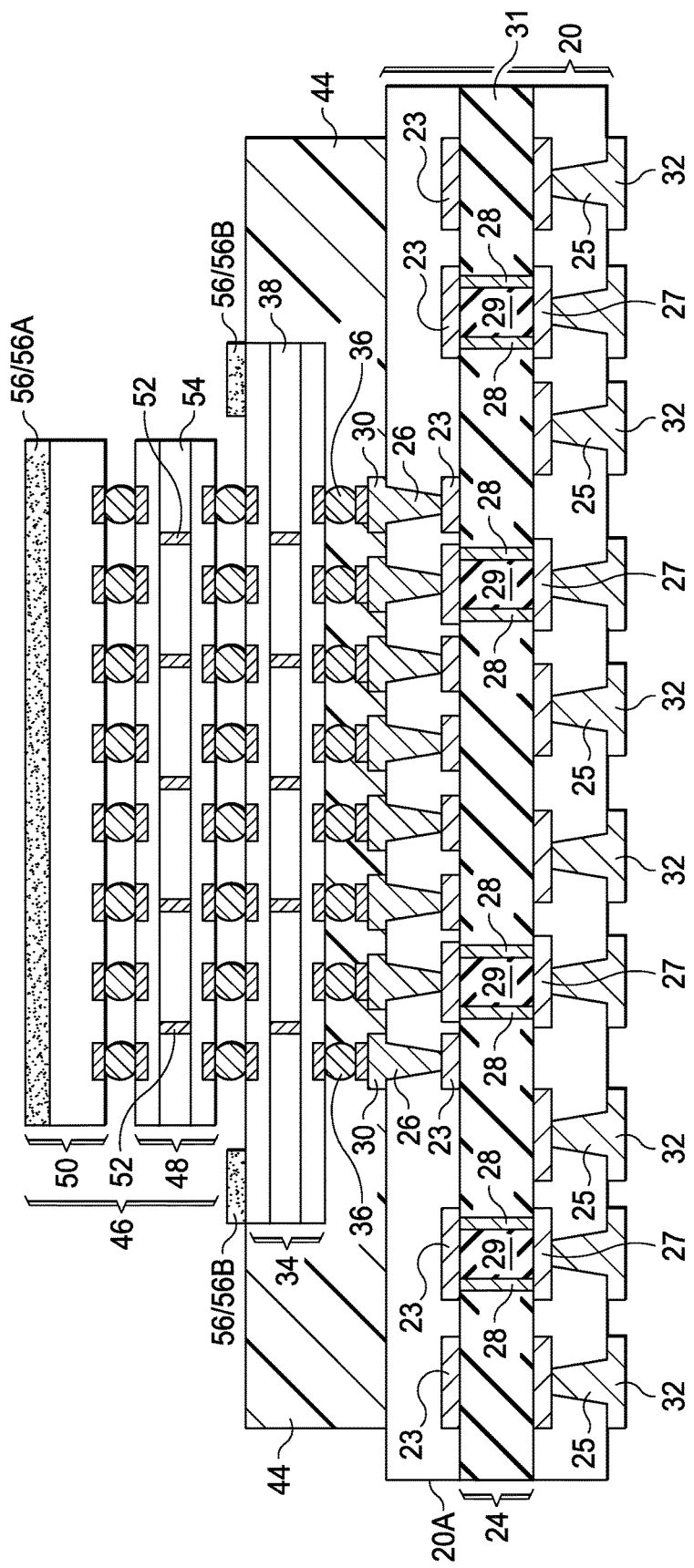

Next, as shown in FIG. 10, TIM 56 is dispensed. In these embodiments, TIM 56 includes portion 56A that is on the top surface of die stack 46, and portion 56B on the top surface of device die 34. Portion 56B may form a full ring or a partial ring encircling die stack 46 (in the top view) in accordance with some embodiments.

Figure 11:
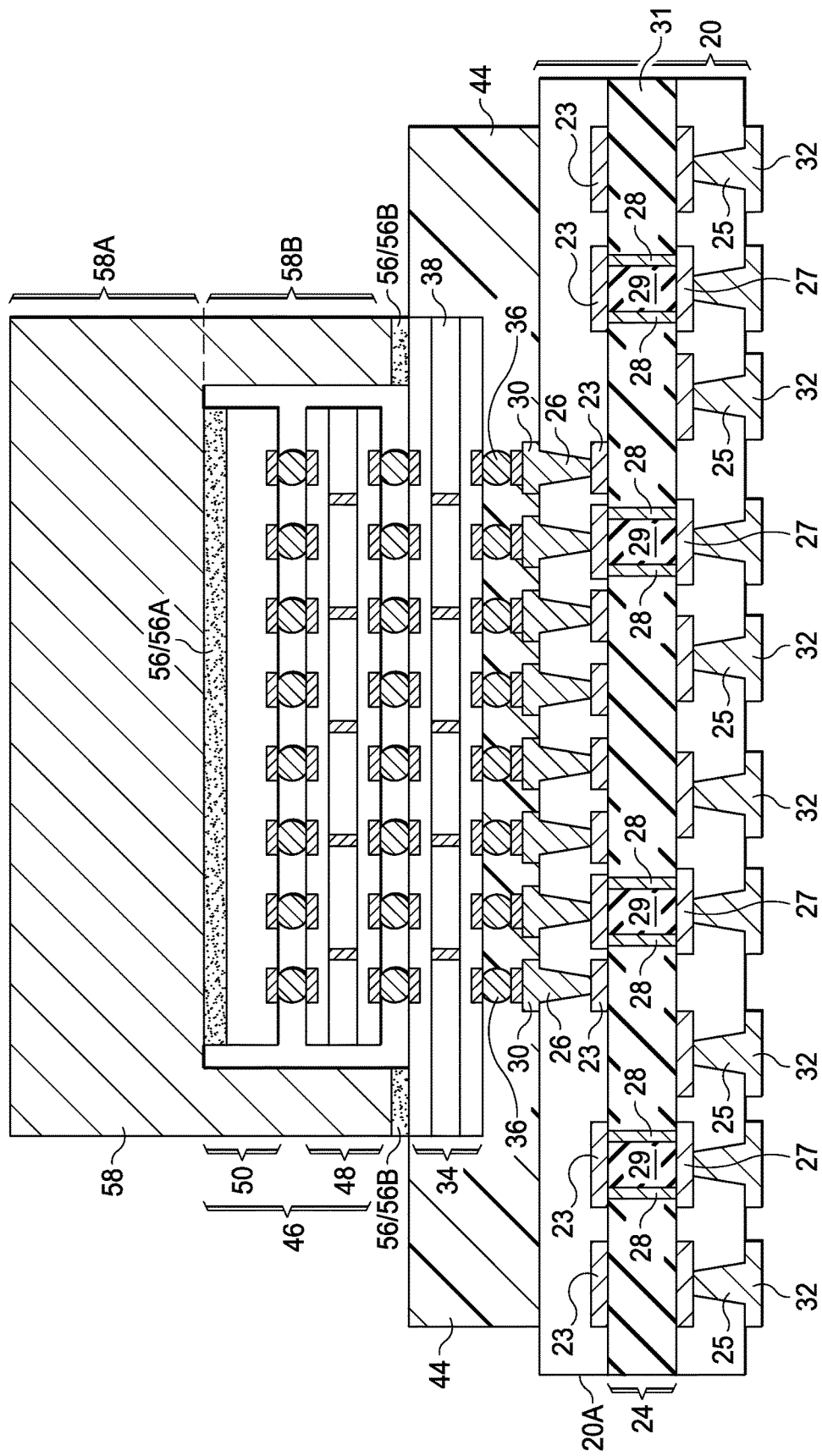

FIG. 11 illustrates the attachment of lid 58 to die stack 46 and device die 34. In some embodiments, lid 58 is a metal lid, which may comprise copper, aluminum, stainless steel, or the like. Lid 58 may include top portion 58A, which is over die stack 46, and ring portion 58B, which is underlying and connected to top portion 58A. Ring portion 58B may form a full ring or a partial ring when viewed in the top view of the structure in FIG. 11. Top portion 58A and ring portion 58B may form an integrated lid with no interface therebetween. The bottom surface of top portion 58A is attached to the top surface of die stack 46 through TIM portion 56A. The bottom surface of ring portion 58B is attached to the top surface of die 34 through TIM portion 56. Hence, lid 58 has improved adhesion to the underlying structure due to the multiple attachment points.

Figure 12A:
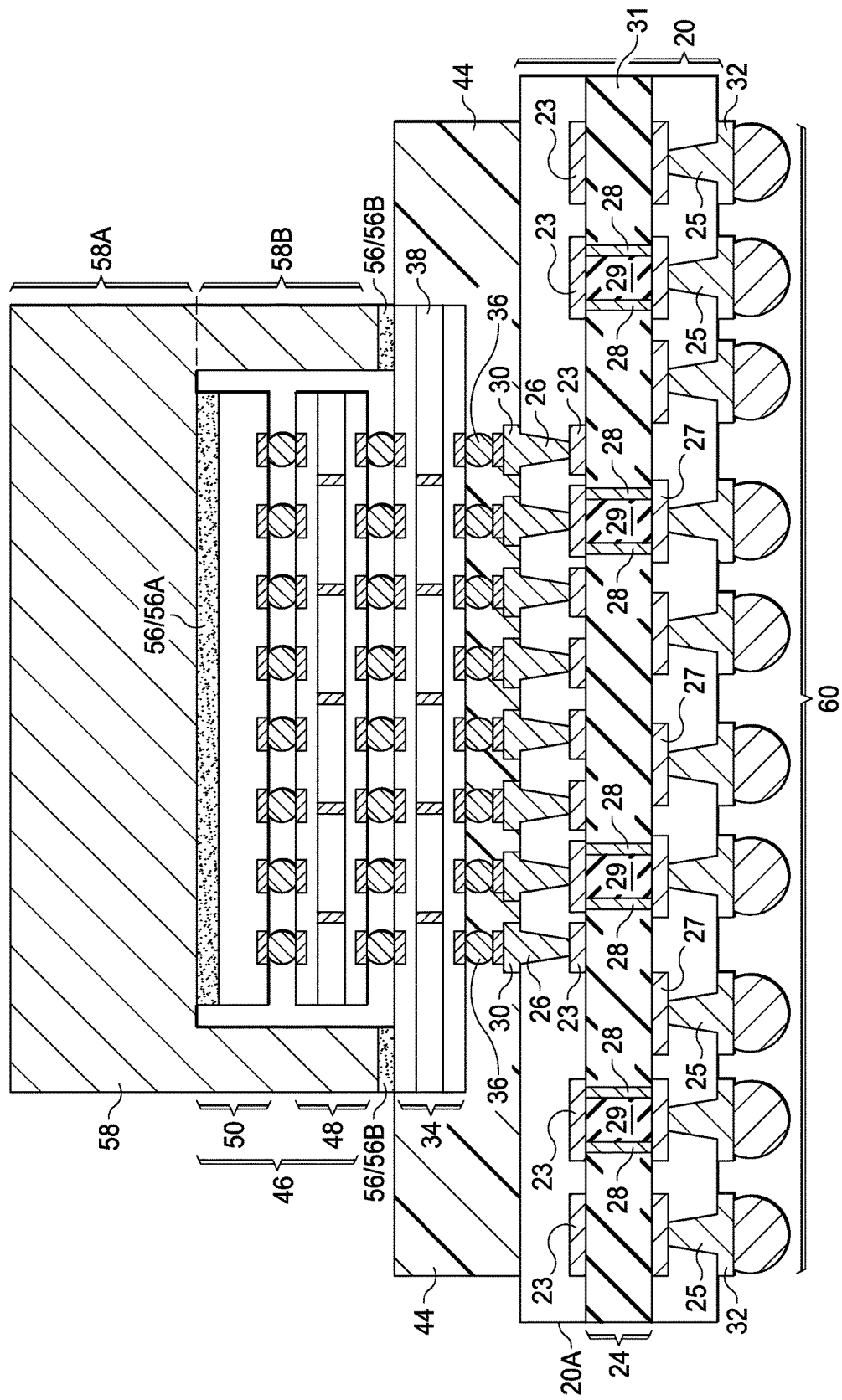
Figure 12B:
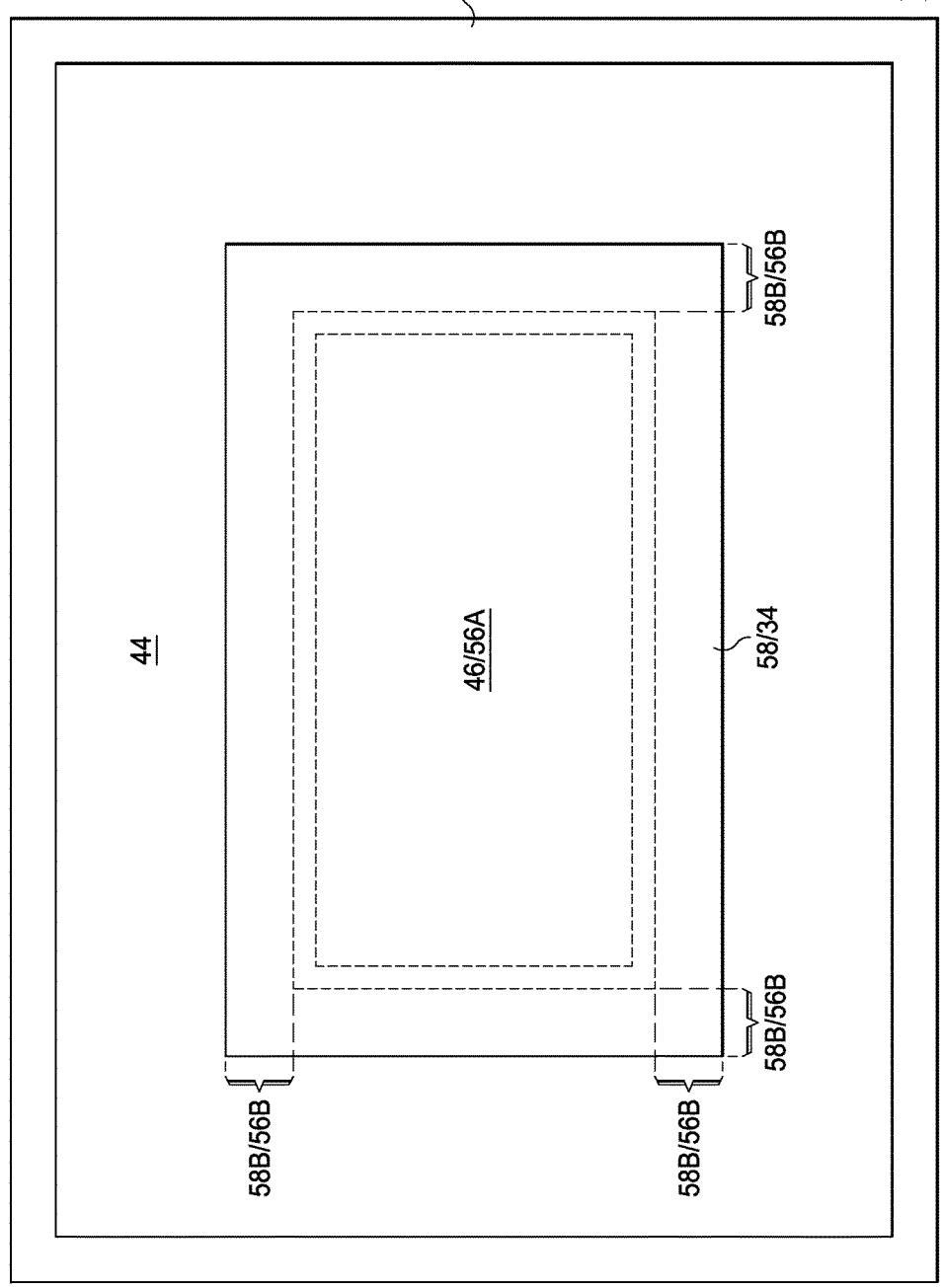
FIG. 12B illustrates a top view of the CoCoS package in accordance with some embodiments.

In FIG. 12A, solder balls 60 are mounted on metal pads 32, and are then reflowed. The formation of the CoCoS package is thus finished. FIG. 12B illustrates a top view of the CoCoS package. As shown in FIGS. 12A and 12B, molding material 44, besides extending into the gap between device die 34, also extends toward the edges of package substrate 20. Hence, molding material 44 also encircles device die 34. As shown in FIG. 12B, ring portion 58B of lid 58 is attached to the outer portion of device die 34 to form a ring.

The embodiments of the present disclosure have some advantageous features. By performing expose molding after a device die is bonded to a package substrate, the warpage of the device die and the package substrate is reduced. The subsequent bonding of more dies onto the device die thus suffers less severe problems due to the reduced warpage of device die. By performing expose molding rather than capillary underfilling to fill the gap between the device die and the package substrate (as performed in conventional packaging steps), the throughput of the packaging is improved since the expose molding is much faster than the capillary underfilling. Furthermore, the problems that occur due to capillary underfilling, such as underfill overflow and underfill bleeding, are avoided in the embodiments of the present disclosure.

In accordance with some embodiments, a method includes bonding a first device die onto a top surface of a package substrate, and performing an expose molding on the first device die and the package substrate. At least a lower portion of the first device die is molded in a molding material. A top surface of the molding material is level with or higher than a top surface of the first device die. After the expose molding, a second device die is bonded onto a top surface of the first device die. The second device die is electrically coupled to the first device die through through-silicon vias in a semiconductor substrate of the first device die.

In accordance with other embodiments, a method includes bonding a first device die onto a package substrate, and molding the first device die in a molding underfill. The molding underfill covers a top surface of the package substrate, and fills a gap between the first device die and the package substrate. The first device die includes a semiconductor substrate, through-silicon vias in the semiconductor substrate, a first plurality of electrical connectors bonded to the package substrate, and a second plurality of electrical connectors. The first and the second plurality of electrical connectors are at opposite sides of the first device die, and are interconnected through the through-silicon vias. After the molding, a second device die is bonded to the second plurality of electrical connectors of the first device die.

In accordance with yet other embodiments, a package includes a package substrate, and a first device die over and bonded to the package substrate. The first device die includes a semiconductor substrate, through-vias in the semiconductor substrate, a first plurality of electrical connectors bonded to the package substrate, and a second plurality of electrical connectors. The first and the second plurality of electrical connectors are at opposite sides of the first device die, and are interconnected through the through-vias. A molding underfill molds the first device die therein. The molding underfill covers a top surface of the package substrate, and fills a gap between the first device die and the package substrate. A top surface of the molding underfill is level with or lower than a top surface of the first device die. A second device die is over and bonded to the first device die.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    bonding a first device die onto a top surface of a package substrate;
    performing an expose molding on the first device die and the package substrate, wherein at least a lower portion of the first device die is molded in a molding material, and wherein a top surface of the molding material is substantially level with a top surface of the first device die;
    after the expose molding, bonding a second device die onto the top surface of the first device die, wherein the second device die is electrically coupled to the first device die through through-semiconductor vias in a semiconductor substrate of the first device die, wherein after the bonding the second device die, the molding material has a lateral width less than a lateral width of the package substrate; and
    attaching a metal lid over the second device die, wherein a region interposed between the first device die and the second device die is free of underfill, wherein the metal lid comprises a ring portion attached directly to the first device die using a first Thermal Interface Material (TIM), the ring portion extending completely around a periphery of second device die, the metal lid being no wider than the first device die.

2. The method of claim 1, wherein the expose molding comprises:
    placing a mold to cover the top surface of the first device die; and
    injecting the molding material into a space between the mold and the package substrate.

3. The method of claim 1 further comprising bonding a third device die onto a top surface of the second device die, where the third device die is electrically coupled to the first device die through additional through-semiconductor vias in an additional semiconductor substrate of the second device die.

4. The method of claim 1, wherein during the expose molding, the molding material is filled into a gap between the first device die and the package substrate, and wherein the molding material comprises a molding underfill.

5. The method of claim 1 further comprising:
    coating a second TIM over the second device die; and
    attaching the metal lid to the second TIM.

6. The method of claim 1, wherein the bonding the first device die onto the top surface of the package substrate comprises solder bonding.

7. The method of claim 1, wherein the package substrate is a build-up substrate comprising:
    a dielectric core comprising epoxy, resin, glass fiber, molding compound, plastic, or a combination thereof;
    a metal via through the dielectric core, the metal via comprising a metal pipe with a dielectric filling and/or air gap in an internal volume of the metal pipe;
    a first metal layer in a first dielectric layer on a first side of the dielectric core, the first device die being bonded to electrical connectors on vias through the first dielectric layer and connected to the first metal layer; and
    a second metal layer in a second dielectric layer on a second side of the dielectric core opposite from the first side of the dielectric core, the first metal layer being connected to the second metal layer by the metal via.

8. A method comprising:
    bonding a first device die onto a package substrate, the package substrate being free of an integrated circuit;
    molding the first device die in a molding underfill, wherein the molding underfill covers a top surface of the package substrate and fills a gap between the first device die and the package substrate, the molding underfill extending from the package substrate to a top surface of the first device die, and wherein the first device die comprises:
        a semiconductor substrate;
        through-semiconductor vias in the semiconductor substrate;
        a first plurality of electrical connectors bonded to the package substrate; and
        a second plurality of electrical connectors, wherein the first and the second plurality of electrical connectors are at opposite sides of the first device die, and are interconnected through the through-semiconductor vias;
    after the molding, bonding a second device die to the second plurality of electrical connectors of the first device die, wherein after bonding the second device die, a lateral dimension of the top surface of the package substrate is greater than a lateral dimension of the molding underfill in a direction parallel to the top surface of the package substrate;
    coating a first Thermal Interface Material (TIM) over the first device die and a second TIM over second device die; and
    attaching a metal lid to the first device die with the first TIM and to the second device die with the second TIM, wherein the metal lid extends completely over and around the second device die, and wherein the metal lid is no wider than the first device die.

9. The method of claim 8, wherein the molding comprises transfer molding, wherein the transfer molding comprises:
    placing a mold to cover the first device die and the package substrate; and
    injecting the molding underfill into a space between the mold and the package substrate.

10. The method of claim 9, wherein during the molding, a bottom surface of the mold contacts the top surface of the first device die.

11. The method of claim 8, further comprising bonding a third device die to the second device die.

12. The method of claim 8, wherein after the molding the first device die, the top surface of the first device die is exposed, and wherein the molding underfill comprises a top surface level with the top surface of the first device die.

13. The method of claim 8, wherein the package substrate is a build-up substrate comprising:
    a dielectric core comprising epoxy, resin, glass fiber, molding compound, plastic, or a combination thereof;
    a metal via through the dielectric core, the metal via comprising a metal pipe;
    a first metal layer in a first dielectric layer on a first side of the dielectric core, the first device die being bonded to electrical connectors on vias through the first dielectric layer and connected to the first metal layer; and
    a second metal layer in a second dielectric layer on a second side of the dielectric core opposite from the first side of the dielectric core, the first metal layer being connected to the second metal layer by the metal via.

14. The method of claim 13, further comprising a dielectric filling in an internal volume of the metal pipe.

15. The method of claim 13, further comprising an air gap in an internal volume of the metal pipe.

16. A method comprising:
bonding a first device die onto a top surface of a package substrate, wherein the first device die comprises electrical connectors at a top surface of the first device die, and wherein the package substrate is free of an integrated circuit;
placing a mold onto the package substrate, with the mold covering the electrical connectors of the first device die;
injecting a molding material into the mold, wherein the molding material is filled into a gap between the first device die and the package substrate, and wherein an upper surface of the molding material is level with the top surface of the first device die;
after injecting the molding material into the mold, bonding at least one second device die to the electrical connectors of the first device die, wherein after bonding the at least one second device die, a lateral width of the molding material is less than a lateral width of the package substrate; and
attaching a lid to the first device die with a thermal interface material, the lid having a same width as the first device die, the lid extending over the at least one second device die, the lid comprising a ring portion that extends completely around the at least one second device die in a plan view.

17. The method of claim 16, wherein the lid is attached to a top die in the at least one second device die through an additional thermal interface material.

18. The method of claim 16, wherein the upper surface of the molding material is a substantially flat top surface, and wherein after the lid is attached, the substantially flat top surface forms a ring encircling the ring portion of the lid.

19. The method of claim 16, wherein when the mold is placed, the mold has a bottom surface contacting the top surface of the package substrate.

20. The method of claim 16, wherein the at least one second device die comprises a plurality of second device dies, the plurality of second device dies being bonded to each other to form a die stack prior to bonding the at least one second device die to the electrical connectors of the first device die.

* * * * *